United States Patent [19]

Shah et al.

[11] Patent Number: 4,810,906
[45] Date of Patent: Mar. 7, 1989

[54] VERTICAL INVERTER CIRCUIT

[75] Inventors: Ashwin H. Shah, Dallas; Pallab K. Chatterjee, Richardson, both of Tex.

[73] Assignee: Texas Instruments Inc., Dallas, Tex.

[21] Appl. No.: 186,724

[22] Filed: Apr. 22, 1988

Related U.S. Application Data

[60] Division of Ser. No. 797,316, Nov. 12, 1985, abandoned, Continuation-in-part of Ser. No. 780,500, Sep. 25, 1985, Pat. No. 4,740,826.

[51] Int. Cl.⁴ .............. H03K 19/017; H03K 19/094; H01L 27/02
[52] U.S. Cl. .................... 307/448; 307/451; 307/445; 307/304; 307/450; 357/42; 357/23.4
[58] Field of Search ............... 307/304, 450, 451, 445, 307/448; 357/42, 23.4

[56] References Cited

U.S. PATENT DOCUMENTS

| | | | |
|---|---|---|---|
| 3,518,509 | 6/1970 | Cullis | 357/42 |
| 4,028,556 | 6/1977 | Cachier et al. | 307/450 |
| 4,038,563 | 7/1977 | Zuleeg et al. | 307/450 |
| 4,462,040 | 7/1984 | Ho et al. | 357/23.4 |
| 4,554,570 | 11/1985 | Jastrzebski et al. | 357/23.7 |
| 4,566,025 | 1/1986 | Jastrzebski et al. | 357/23.7 |

FOREIGN PATENT DOCUMENTS

60-02716  6/1985  Japan ..................... 357/42

Primary Examiner—Martin H. Edlow
Assistant Examiner—Donald J. Featherstone
Attorney, Agent, or Firm—Ferdinand M. Romano; James T. Comfort; Melvin Sharp

[57] ABSTRACT

One embodiment of the present invention includes a vertical inverter. A layer of P-type material is formed on the surface of an N+-type substrate, followed by formation of an N+ layer, a P+ layer, an N— layer, and a P+ layer. (Of course different doping configurations may be used and remain within the scope of the invention.) A trench is then etched along one side of the stack thus formed and a connector is formed to the middle P+ and N— layers. Another trench is then formed where a gate insulator and a— gate are formed. The gate serves as the gate for both the N-channel and P-channel transistors thus formed.

2 Claims, 8 Drawing Sheets

VERTICAL INVERTER CIRCUIT

RELATED APPLICATIONS

This application is a continuation-in-part of U.S. application Ser. No. 780,500, now U.S. Pat. No. 4,740,826 filed Sept. 25, 1985.

FIELD OF THE INVENTION

The present invention relates to the field of integrated circuit fabrication techniques. More specifically, the present invention relates to complementary metal-oxide semiconductor (CMOS) design.

BACKGROUND OF THE INVENTION

The present integrated circuit fabrication techniques, where components are fabricated in the semiconductor substrate horizontally along the surface of the semiconductor substrate, are approaching insurmountable limitations in reducing the size of devices so formed. Lithographic techniques are being limited by fringing effects of even ultraviolet light and closely spaced horizontal field effect transistors are proving more and more prone to latchup. Consequently it is an object of the present invention to provide a technique which circumvents these problems.

One solution developed for individual field effect transistors is the use of vertical structures. Examples of these are Chang et al. Vertical FET Random-Access Memories with Deep Trench Isolation, IBM Technical Dislosure, Vol 22, No. 8B. January 1980 and copending application Ser. No. 679,663, filed Dec. 7, 1984, abandoned Oct. 14, 1987, which are hereby incorporated by reference. However, prior techniques for fabricating vertical transistors only apply to single transistors of a selected single conductivity type. Thus the use of CMOS, with it low power consumption and small logic cell layout size, using prior vertical transistor fabrication techniques is difficult if not impossible.

SUMMARY

One embodiment of the present invention includes a vertical inverter. A layer of P-type material is formed on the surface of an N+-type substrate, followed by formation of an N+layer, a P+layer, an N−layer, and a P+layer. (Of course different doping configurations may be used and remain within the scope of the invention.) A trench is then etched along one side of the stack thus formed and a connector is formed to the middle P+ and N+layers. Another trench is then formed where a gate insulator and a gate are formed. The gate serves as the gate for both the N-channel and P-channel transistors thus formed. Another embodiment of the present invention is a circuit which uses the interconnection points available in the above described vertical inverter to provide a logical NOR gate.

DETAILED DESCRIPTION

Figure 1A:
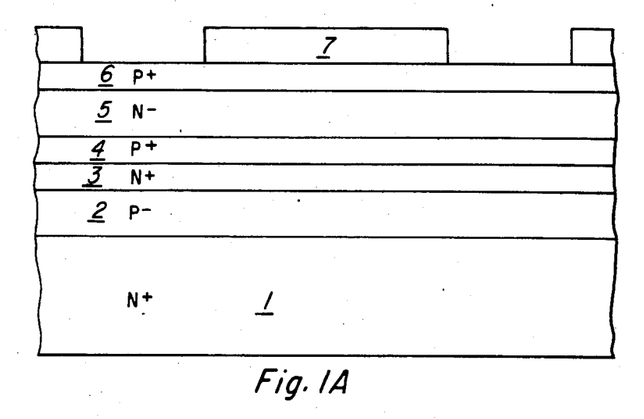
FIGS. 1A through 1G are side view schematic diagrams depicting the processing steps necessary to fabricate one embodiment of the invention of the parent application.
Figure 1B:
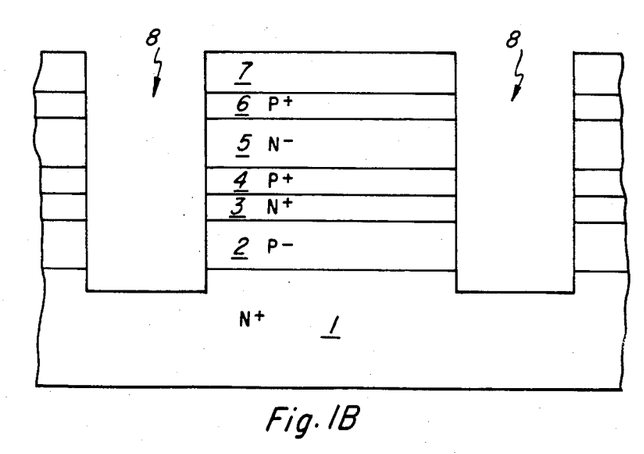

FIG. 1A is a side view schematic diagram depicting the initial processing steps for fabricating one embodiment of the invention of the parent case. Epitaxial layers 2 through 6 are fabricated on the surface of substrate 1 using, for example, molecular beam epitaxial techniques. Using these techniques very abrupt transitions between N and P type doping material may be fabricated. For example, using present techniques, P-type layer 2 may be approximately 2000 to 5000 angstroms thick. N+layer 3 may be 1000 to 2000 angstroms thick. P+layer 4 may be 1000 to 2000 angstroms thick. N−layer 5 may be 2000 to 5000 angstroms thick and P+layer 6 is approximately 1000 to 2000 angstroms thick. Of course, thinner or thicker layers are considered within the scope of the invention. The thickness of these layer determines, among other things, the channel lengths of the transistors. The channel length of the N-channel transistor in this embodiment is determined by the thickness of layer 2 and the channel length of the P-channel transistor in this embodiment is determined by the thickness of layer 5. Masking layer 7 is formed of a suitable masking material and patterned using commonly known photolithographic techniques on the surface of P+layer 6. Masking layer 7 is used during an etching process to fabricate trenches 8 as shown in FIG. 1B.

Figure 1C:
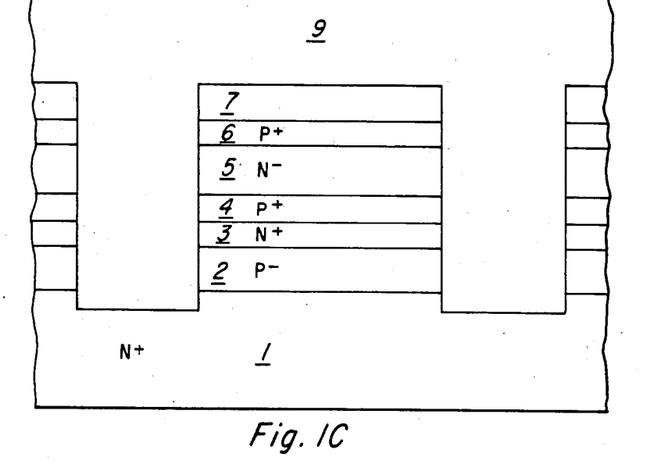
Figure 1D:
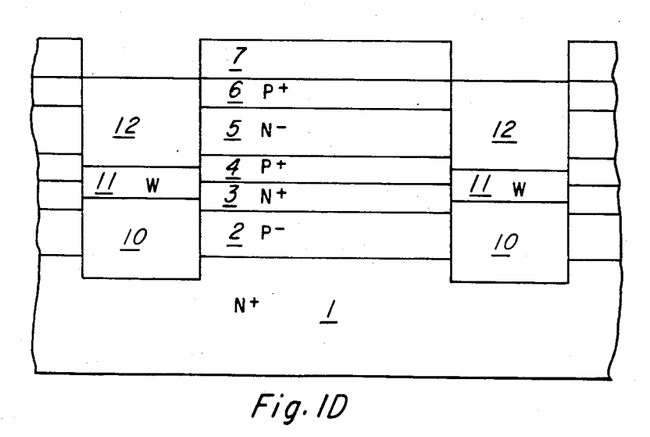

Trenches 8 are fabricated with two objects in mind. The primary object is fabrication of an interconnection layer between vertical inverters as they are subsequently described in this detailed description. A secondary object is to provide isolation between vertical inverters fabricated as described in this detailed description. The isolation regions 20 (shown in the plan view of FIG. 2) will be masked so as to provide an area in trenches 8 which is entirely filled with silicon dioxide. Silicon dioxide layer 9 is formed on the surface of the structure of FIG. 1B as shown in FIG. 1C using, for example, chemical vapor deposition. Silicon dioxide layer 9 is etched back to provide silicon dioxide isolation regions 20 (FIG. 2) which fill trenches 8 in regions where specific vertical inverters are to be electrically isolated from each other. In other areas of the integrated circuit silicon dioxide layer 9 is etched back to provide silicon dioxide plugs 10 as shown in FIG. 1D. Similar filling and etch back techniques are used to fabricate tungsten layers 11 and silicon dioxide layers 12. Layer 11 is tungsten as an example, other conductive materials may be substituted for tungsten in layer 11. An advantageous property of a substitute material for tungsten is the ability to conformally deposit the substitute material. This property helps avoid voids between the deposited material and the surface deposited upon, which is a particular problem when depositing into trenches. Masking layer 7 is then removed and masking layer 13 is formed on the surface of the structure of FIG. 1D.

Figure 1E:
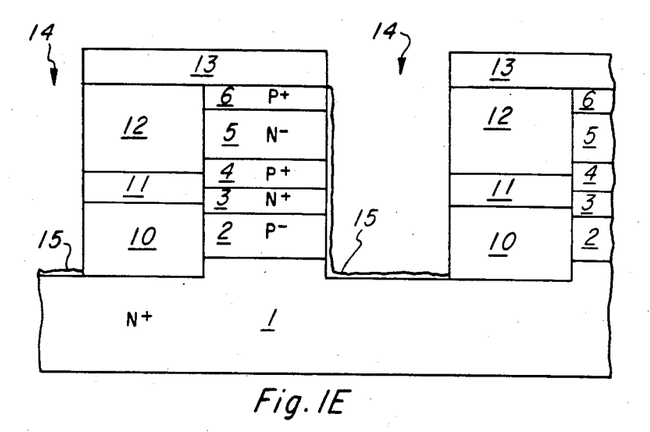
Figure 1F:
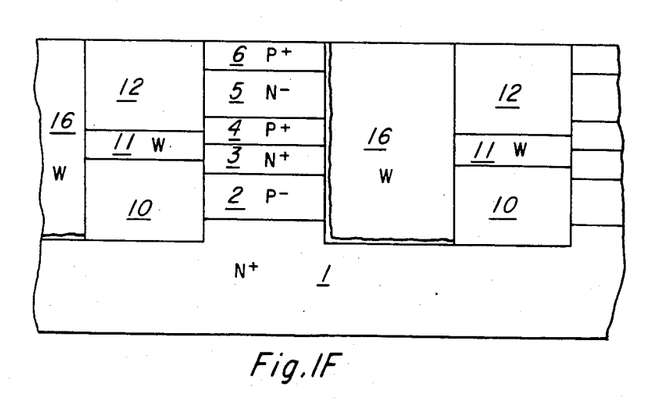

Masking layer 13 is used to mask the etching processes used to fabricate trenches 14 as shown in FIG. 1E. The structure of FIG. 1E is then subjected to a thermal oxidation process to provide silicon dioxide layers 15 as shown in FIG. 1E. Care must be used in this step in order to provide adequate gate insulation for the vertical inverter but not cause excessive diffusion of the dopants in layers 2 through 6 and thereby destroy the definition of the vertical transistors. Tungsten gates 16 are then formed in trenches 14 using a fill and etch back technique as earlier described with regard to layer 9. Appropriate interconnections are then fabricated on the surface of the structure of FIG. 1F as shown in FIG. 1G.

Figure 1G:
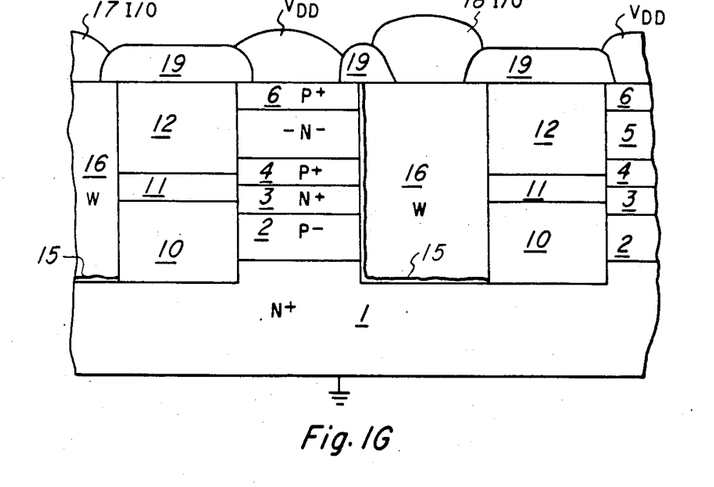

Tungsten gates 16 serve as input and output connections 17 and 18 as shown in FIG 1G. Positive voltage is applied to P+layers 6 and ground voltages applied to substrate 1 thus providing a vertical complementary metal oxide semiconductor inverter. The P channel transistor is formed by P+layer 6 which serves as a source, P+layer 4 which serves as a drain and N—layer 5 which provides a channel region. The gate of the P channel transistor is formed by a tungsten gate 16. The N channel transistor is formed by N+layer 3 which serves as a drain, N+substrate 1 which serves as a source and P—layer 2 which provides a channel region, the gate of the N channel transistor is formed by tungsten gate 16.

Figure 2:
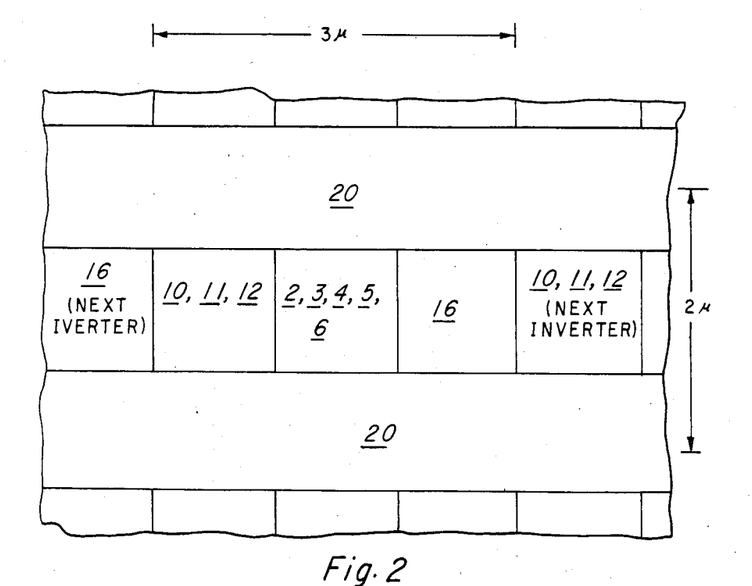
FIG. 2 is a plan view of the embodiment shown in FIGS. 1A through 1G configured with adjacent vertical inverters in an inverter chain.

The horizontal limitations on the size of the tungsten gate 16, the transistor stacks provided by layers 2 through 6 and interconnection region 11 is limited by the photolithographic techniques used to fabricate this embodiment of the present invention. FIG. 2 is a plan view showing the layout of the vertical inverter in an inverter chain. Using present techniques (i.e. lithography techniques capable of 1 micron minimum geometries) the entire vertical inverter would occupy approximately 3 microns wide as shown horizontally in FIG. 1G and would be approximately 1 micron thick using the thickness perpendicular to the plane of the page plus another micron thick for the isolation regions 20. Thus an entire CMOS inverter is provided in an area of approximately 6 square microns as shown in FIG. 2. In addition, the inverter is nearly impervious to latch-up problems because the inverter is comprised of a 5 layer stack between positive voltage supply and ground with no intervening junction between an N-tank and a P-tank. Latch-up occurs when a four layer PNPN (or NPNP) stack, which forms a silicon controled rectifier, is turned on between the voltage supply terminal and ground. Because there is a five layer stack (six including the substrate) in this embodiment between the voltage supply and ground, this problem is completely avoided.

FIG. 2 is a plan view of the structure fabricated using the steps of FIG. 1A through 1G.

Figure 3A:
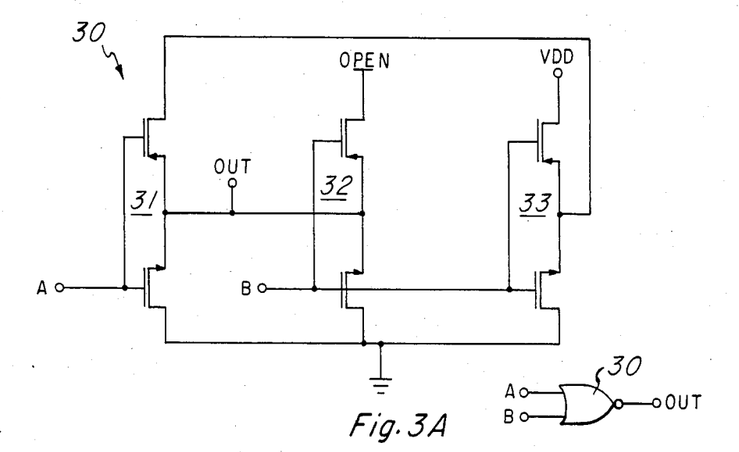
FIGS. 3A and 3B are circuit schematic diagrams depicting NOR gates which are embodiments of the present invention.

FIG. 3A is a schematic diagram of a logical NOR gate formed using three of the vertical inverters formed as shown in FIG. 1G. Input signal A is applied to the gates of inverter 31. The source of the P channel transistor of inverter 31 is attached to the output lead of inverter 33. The output lead of inverter 31 provides signal OUT. Input signal B is applied to the gates of inverter 32 and inverter 33. The output lead of inverter 32 also provides the signal OUT. The source of the P channel transistor of inverter 32 is left open and the source of the P channel transistor of inverter 33 is connected to positive voltage supply $V_{DD}$. The sources of the N channel transistors of inverters 31, 32 and 33 are connected to ground.

When a logical 1 (approximately five volts) signal is applied as input signal A, the N channel transistor of inverter 31 conducts and signal OUT is pulled to ground potential. If a logical 1 input signal is applied as input signal B at this time, the N channel device of inverter 32 is ON and the N channel device of inverter 33 is ON. Because the N channel transistor of inverter 33 is ON, ground potential is applied at a source of the P channel transistor of inverter 31. However, the P channel transistor of inverter 31 is OFF, thus the output signal provided from inverter 33 does not effect signal OUT. If the input signal A is then changed to a logical 0 (approximately 0 volts), the N channel transistor of inverter 31 will be turned OFF and the P channel transistor of inverter 31 will be turned ON thus the output signal provided by inverter 33 is applied to provide signal OUT. In this circumstance (input Signal A logical 0, input signal B logical 1), both inverter 32 and inverter 33 provide an output signal of logical 0 as signal OUT. If input signal A is a logical 1 and input signal B is a logical 0, the N channel transistor of inverter 31 is ON and the P channel transistor of inverters 32 and 33 are ON. Because the N channel transistor of inverter 31 is ON, a logical 0 output signal is applied as signal OUT. Because the P channel transistor of inverter 32 is open at its source, inverter 32 provides no output signal to signal OUT. Because the P channel transistor of inverter 33 is ON, a 1 output signal is provided from output lead of inverter 33; however, because the P channel transistor of inverter 31 is OFF, the output signal of inverter 33 has no effect on signal OUT. If both input signal A and input signal B are logical 0's, the P channel transistors of inverters 31, 32 and 33 are ON. Because the source of the P channel transistor of inverter 32 is open, inverter 32 has no influence on signal OUT. Because the P channel transistor of inverter 33 is ON, the output signal of inverter 33 is a logical 1 which is applied to the source of inverter 31. Because the P channel transistor of inverter 31 is ON, the output signal of inverter 33 is applied as signal OUT. Thus circuit 30 functions as a logical NOR gate.

Figure 3B:
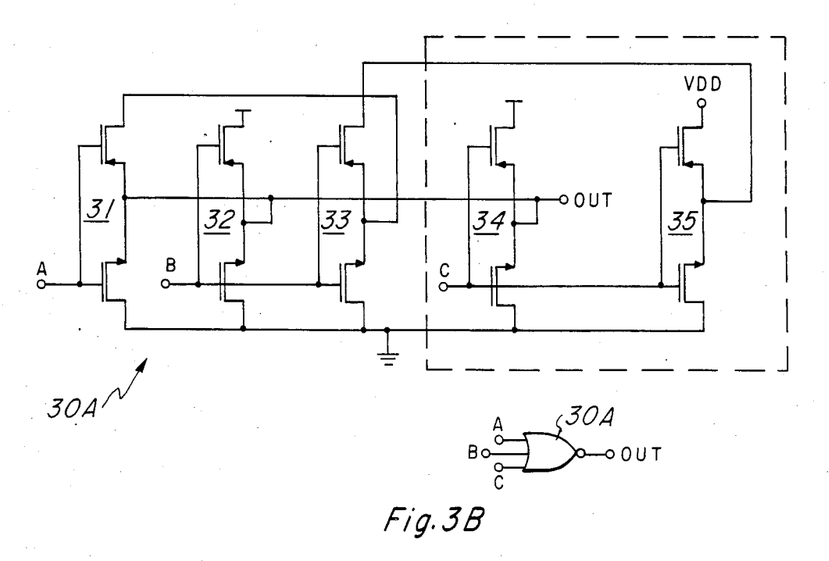

FIG. 3B is a three input NOR gate 30A using the same basic design as NOR gate 30(FIG. 3A) but adding inverters 34 and 35 to allow the addition of input signal C in the operation of the gate. A NOR gate using any number of input signals can thus be fabricated. Additional input signals require two additional inverters: one inverter must have its P channel transistor connected in series between $V_{DD}$ and the output lead and the other inverter must have its N channel transistor connected in parallel between the output lead and ground.

Figure 4:
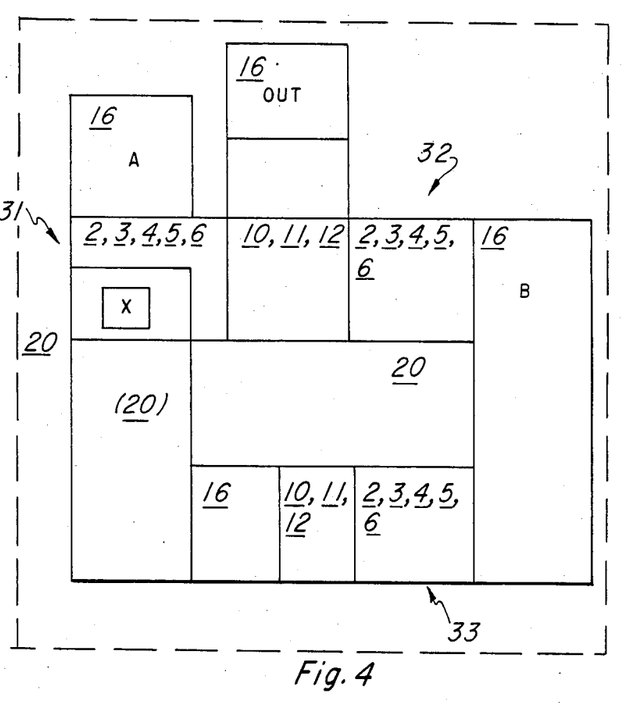
FIG. 4 is a plan view of the circuit shown in FIG. 3A.

FIG. 4 is a plan view of NOR gate 30 implemented using the structure as shown in FIG. 1G. Note that tungsten regions 16 provide not only the gates of inverters 31, 32 and 33 but also provide connections between buried output leads 11 to the surface of the integrated circuit.

Figure 5A:
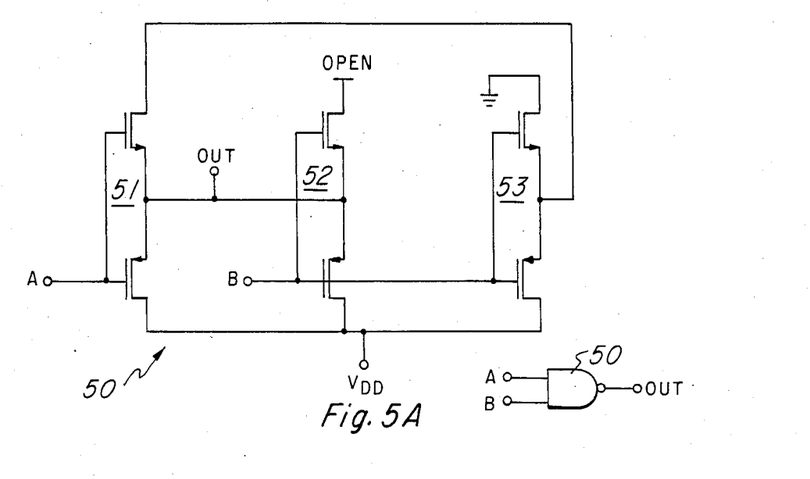
FIGS. 5A and 5B are schematic diagrams of NAND gates which are other embodiments of the invention.

FIG. 5A is a schematic diagram of a logical NAND gate formed using three of the vertical inverters formed as shown in FIG. 1G. Input signal A is applied to the gates of inverter 51. The source of the N channel transistor of inverter 51 is attached to the output lead of inverter 53. The output lead of inverter 51 provides signal OUT. Input signal B is applied to the gates of inverter 52 and inverter 53. The output lead of inverter 52 also provides the signal OUT. The source of the N channel transistor of inverter 52 is left open and the source of the N channel transistor of inverter 53 is connected to ground. The sources of the P channel transistors of inverters 51, 52 and 53 are connected to the positive voltage supply $V_{DD}$.

When a logical 0 (approximately 0 volts) signal is applied as input signal A, the P channel transistor of inverter 51 conducts and signal OUT is pulled to $V_{DD}$ which approximately 5 volts (logical 0). If a logical 0 input signal is applied as input signal B at this time, the P channel device of inverter 52 is ON and the P channel device of inverter 53 is ON. Because the P channel transistor of inverter 53 is ON, $V_{DD}$ potential is applied at the source of the N channel transistor of inverter 51. However, the N channel transistor of inverter 51 is OFF, thus the output signal provided from inverter 53 does not effect signal OUT. If the input signal A is then changed to a logical 1, the P channel transistor of inverter 51 will be turned OFF and the N channel transistor of inverter 51 will be turned ON thus the output signal provided by inverter 53 is applied to provide signal OUT. In this circumstance (input Signal A logical 1, input signal B logical 0), both inverter 52 and inverter 53 provide an output signal of logical 1 as signal OUT. If input signal A is a logical 0 and input signal B is a logical 1, the P channel transistor of inverter 51 is ON and the N channel transistors of inverters 52 and 53 are ON. Because the P channel transistor of inverter 51 is ON, a logical 1 output signal is applied as signal OUT. Because the N channel transistor of inverter 52 is open at its source, inverter 52 provides no output signal to signal OUT. Because the N channel transistor of inverter 53 is ON, a logical 0 output signal is provided from the output lead of inverter 53; however, because the N channel transistor of inverter 51 is OFF, the output signal of inverter 53 has no effect on signal OUT. If both input signal A and input signal B are logical 1's, the N channel transistors of inverters 51, 52 and 53 are ON. Because the source of the N channel transistor of inverter 52 is open, inverter 52 has no influence on signal OUT. Because the N channel transistor of inverter 53 is ON and the output signal of inverter 53, which is a logical 1, is applied to the source of inverter 51. Because the N channel transistor of inverter 51 is ON, the output signal of inverter 53 is applied as signal OUT. Thus circuit 50 functions as a logical NAND gate.

Figure 5B:
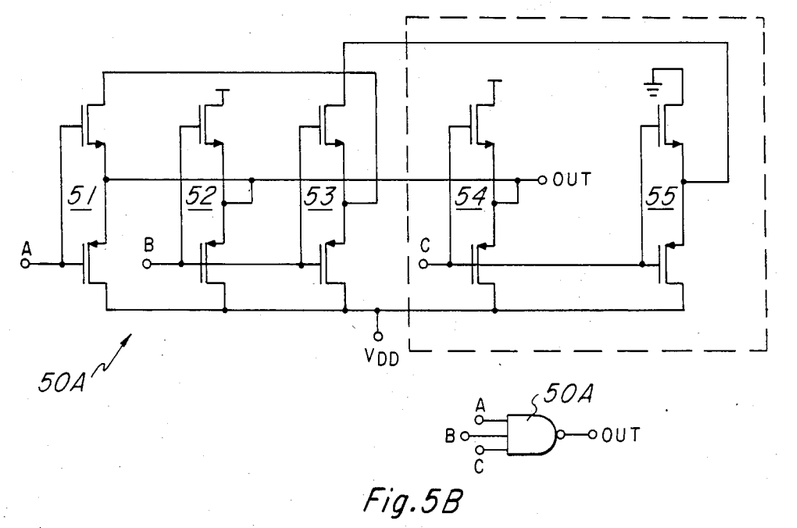

FIG. 5B is a three input NOR gate 50A using the same basic design as NOR gate 50(FIG. 5A) but adding inverters 54 and 55 to allow the addition of input signal C in the operation of the gate. A NOR gate using any number of input signals can thus be fabricated. Additional input signals require two additional inverters: one inverter must have its P channel transistor connected in parallel between $V_{DD}$ and the output lead and the other inverter must have its N channel transistor connected in series between the output lead and ground.

Although specific embodiments of the present invention are herein described, this is not to be construed as limiting the scope of the present invention. Other embodiments of the present invention will become obvious to those skilled in the art in light of the teachings of the present invention. This invention is only limited by the claims appended thereto.

TECHNICAL ADVANTAGES

The present invention provides an extremely small vertical inverter occupying a minimum of surface area of an integrated circuit. In addition, the present invention provides a vertical inverter which is nearly impervious to latchup problems experienced by techniques now known in the art.

I claim:
1. A logic gate comprising:
    a first inverter having an input lead connected to a first input node, a first power lead, a second power lead connected to a first potential and an output lead connected to an output node;
    a second inverter having an input lead connected to a second input node, a first power lead which is unconnected, a second power lead connected to said first potential and an output lead connected to said output node; and
    a third inverter having an input lead connected to said second input node, a first power lead connected a second potential, a second power lead connected to said first potential and an output lead connected to said first power lead of said first inverter.

2. A logic gate as in claim 1 having said inverters formed on a substrate of a first conductivity type, said inverters comprising:
    a first channel layer of a second conductivity type formed on the surface of said substrate;
    a first drain layer of said first conductivity type formed on the surface of said first channel layer;
    a second drain layer of said second conductivity type formed on the surface of said first drain layer;
    a second channel layer of said first conductivity type formed on the surface of said second drain layer;
    a source layer of said second conductivity type formed on the surface of said second channel layer;
    a conductive gate vertically disposed on an edge perpendicular to the plane of and adjacent to said first and second channel layers, said first and second drain layers and said source layer wherein said gate is insulated from said layers; and
    a conductive region connected to said first and second drain layer.

* * * * *